United States Patent [19]

Weiss

[11] Patent Number: 5,491,303
[45] Date of Patent: Feb. 13, 1996

[54] SURFACE MOUNT INTERPOSER

[75] Inventor: Michael L. Weiss, Coral Springs, Fla.

[73] Assignee: Motorola, Inc., Schaumburg, Ill.

[21] Appl. No.: 210,509

[22] Filed: Mar. 21, 1994

[51] Int. Cl.$^6$ .................................................. H05K 1/14
[52] U.S. Cl. ........................... 174/262; 174/261; 439/65; 439/74; 439/83; 361/790
[58] Field of Search .................................. 174/250, 255, 174/261, 262, 263, 264, 265, 266; 228/179, 180.1, 180.2; 361/767, 784, 785, 788, 790; 439/65, 66, 68, 69, 70, 74, 76, 83, 84

[56] References Cited

U.S. PATENT DOCUMENTS 4,642,889  2/1987  Grabbe ........................................ 29/840
5,218,761  6/1993  Maniwa et al. .
5,258,648  2/1993  Lin .

*Primary Examiner*—Laura Thomas
*Attorney, Agent, or Firm*—Dale W. Dorinski

[57] ABSTRACT

An interposer (100) for connecting two or more printed circuit boards (302, 304) is a circuit-carrying substrate (102) with two or more solder pads (104, 109) on each of two sides (105, 107). Each of the solder pads are connected to an electrically conductive via (106) in the substrate, providing electrical interconnection from one side to the other side. Each solder pad has a solder bump (108) on it. A circuit assembly is made by soldering the solder bumps on one side of the interposer to corresponding solder pads on a printed circuit board (302). The solder bumps on the other side of the interposer are likewise soldered to the corresponding solder pads of a second printed circuit board (304).

5 Claims, 2 Drawing Sheets

SURFACE MOUNT INTERPOSER

TECHNICAL FIELD

This invention relates in general to interconnection means, and more particularly to printed circuit board interconnectors.

BACKGROUND

Consumer and other types of electronics all have at least one printed circuit board (PCB), and many have more than one. Those having multiple circuit boards typically interconnect the PCBs by some means. In the prior art, this connection has taken the form of discrete wires, wiring harnesses, flex circuit interconnections, card edge connectors, zero insertion force (ZIF) connectors, plugs, etc. Each of these connections has served a purpose, and each has one or more advantages. However, each also has a disadvantage. For example, discrete wires, wiring harnesses, and flex circuit interconnection typically cannot connect the two PCBs closely together nor can they maintain the PCBs in fixed alignment. Discrete wires require expensive and time consuming manual labor to assemble. Card edge connectors, ZIF connectors, and plugs are better at maintaining fixed alignment, but typically require considerable space in the vertical direction, require assembly labor, and are costly. The advent of surface mount technology has further exacerbated the need for low cost, small connectors that can easily interconnect multiple PCBs and hold them in fixed relationship to one another, while requiring minimal vertical space. Clearly, a need exists in the art for a connector to fulfill this need.

SUMMARY OF THE INVENTION

Briefly, according to the invention, there is provided an interposer for connecting two or more printed circuit boards. The interposer is a circuit-carrying substrate with two or more solder pads on each of the two sides. Each of the solder pads are connected to an electrically conductive via in the substrate, providing electrical interconnection from one side to the other side. Each solder pad has a solder bump on it.

In an alternate embodiment of the invention, a circuit assembly is made by soldering the solder bumps on one side of the interposer to corresponding solder pads on a printed circuit board. The solder bumps on the other side of the interposer are likewise soldered to the corresponding solder pads of a second printed circuit board.

DETAILED DESCRIPTION OF THE PREFERRED EMBODIMENT

Figure 1:
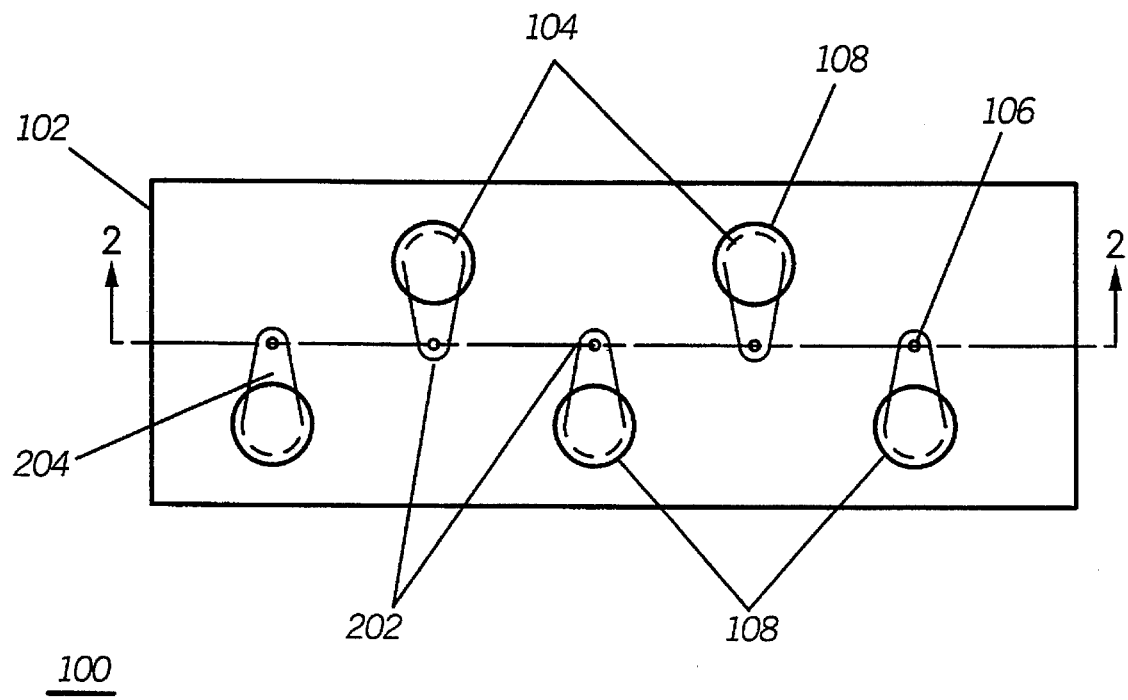
FIG. 1 is a plan view of an interposer in accordance with the invention.

While the specification concludes with claims defining the features of the invention that are regarded as novel, it is believed that the invention will be better understood from a consideration of the following description in conjunction with the drawing figures, in which like reference numerals are carried forward.

Figure 2:
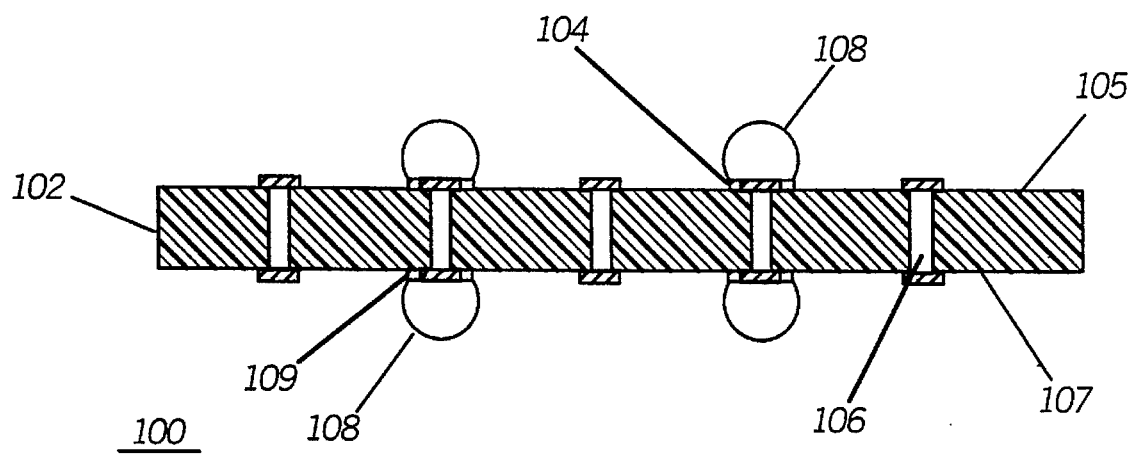
FIG. 2 is a cross-sectional view of FIG. 1 through section 2—2.

Referring now to FIGS. 1 and 2, an interposer 100 is made using a substrate 102, such as a printed circuit board made from epoxy or polyimide resins. The resin is reinforced with a woven glass cloth or other matrix such as chopped glass fibers. This construction is the same as that commonly used in the industry for conventional PCBs. Typically, the material used for the interposer is the same as that used in the printed circuit boards that are to be interconnected. This provides the advantage of reducing the stresses between the PCBs and the interposer, as will be explained later. However, it is not necessary that the interposer be made from the exact same material as the PCB, for example, epoxy PCBs can be connected using a polyimide interposer or vice versa.

On one side 105 of the interposer, a first plurality or set of surface mount pads 104 are formed in a pattern that is a mirror image of the pads on one of the PCBs that are to be connected. These pads are formed in a conventional manner, for example, by subtractive processing of copper clad laminates. The reader will appreciate that the pattern of surface mount pads can take many forms, and need not be limited to the configuration shown in the drawing. Each of the pads is connected to a corresponding plated through hole or via 106 in the substrate. The hole typically passes straight through the substrate, but other constructions such as blind or buried vias that only extend part way through may also be successfully used. In these cases, the interconnection is completed by using another blind or buried via connected to an inner layer of circuitry in the substrate, making the interposer a three layer configuration. The inner layer can also be used as a ground layer, providing a shielding effect for the two PCBs. The important criteria is that an electrical connection be made from one side 105 of the interposer to the other side 107. The drawing shows that the pad 104 is remote from the via 106, and is connected to the via by a conductive trace 204. Other configurations, such as the pad located directly on top of the via or adjacent to the via can also be used and still fall within the scope of the invention. Referring to FIG. 2, on the other or second side 107 of the interposed, another series of surface mount solder pads 109 is formed. This second set of pads 109 resembles the pattern to be connected on the second PCB. Each of the second set of pads is also connected to a respective via 106 in a manner similar to one of the configurations described above with the first set of pads 104. This scheme results in each of the first set of pads 104 on one side 105 being electrically connected to one of the pads 109 in the second set on the other side 107 of the PCB. What separates the interposer of the instant invention from a conventional PCB is the fact that the interposer only has connections for the solder pads, and does not provide other functions such as mounting sites for components or holes for components. Although the interposer is shown in the drawing figures as a rectangular part, the reader will readily appreciate that it could be made in many different shapes, such as an "L", "C", or window frame shape.

Each of the solder pads 104, 109 on both sides of the interposer has a solder ball or solder bump 108 formed on the pad. The solder bumps 108 provide the means to electrically and mechanically connect the two PCBs together. The solder bump is formed using any number of methods such as printing solder paste, using solder preforms, by plating or cladding solder, or by depositing solder spheres on the pads. In each of the methods, the solder material is reflowed to ensure that the solder material is firmly adhered to the underlying copper pad. After reflow, the solder material usually assumes the shape of a modified sphere, as shown in the drawing. With the addition of the solder bumps 108, the interposer 100 is now complete, and ready for use.

Figure 3:
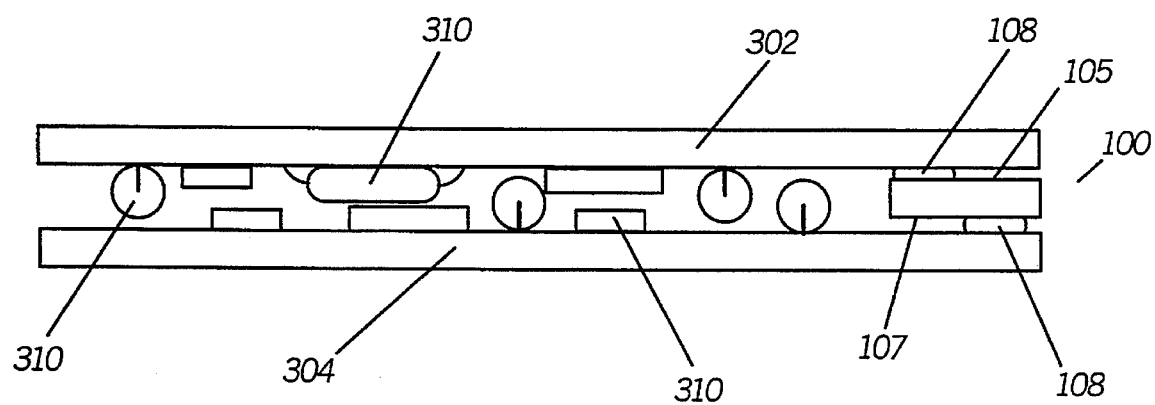
FIG. 3 is a side view of an assembly made using by connecting two printed circuit boards with an interposer in accordance with the invention.

Referring now to FIG. 3, the solder bumps 108 on the first side 105 of the interposer are aligned to the solder pads on a first PCB 302 and are reflowed. Each of the solder bumps 108 on the second side 107 of the interposer is also aligned to one of the solder pads on the second PCB 304 and reflowed. This arrangement provides a direct and robust electrical and mechanical connection between each of the solder pads on the first PCB 302 and each of the solder pads on the second PCB 304. It can be seen that one advantage of this type of configuration is that the interposer also provides structural rigidity to the assembled structure, and also holds each PCB in fixed alignment to the other. Because of the thin cross section of the interposer, the two PCBs 302, 304 are interconnected very closely and do not require any more vertical space than would normally be required for the components 310 themselves. This allows the two PCBs to be mated close together, allowing smaller products to be made. More than two PCBs can be connected together using the interposer. For example, three PCBs can be vertically connected using two interposers. The concept can be further extended to couple many PCBs together vertically.

By using an interposer made from materials similar to the PCBs, the thermal expansion or contraction of each of the members of the assembly is now the same, thus ameliorating the problems usually found with thermal stress in the prior art. It will be appreciated that if the materials are not similar, the rigid construction of the present invention would result in significant stress between each member.

It can be seen that the present invention provides several significant advantages, while eliminating some of the disadvantages of the prior art. PCBs can be mated together with minimal vertical height, the PCBs can be held in fixed relationship to each other, and structural rigidity is provided. The interposer can be inexpensively made, and custom configurations are readily available, because the pattern of pads and holes is easily changed.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A printed circuit assembly, comprising:
    a first printed circuit board having a plurality of solder pads;
    a second printed circuit board having a plurality of solder pads;
    an interposer, comprising;
        a circuit-carrying substrate having two major opposing surfaces and having a plurality of electrically conductive vias;
        a plurality of first solder pads on one of the major surfaces, corresponding to the plurality of solder pads on the first printed circuit board, each of said first solder pads electrically connected to an electrically conductive via;
        a plurality of second solder pads on the other major surface, corresponding to the plurality of solder pads on the second printed circuit board, each of said second solder pads electrically connected to an electrically conductive via and to a corresponding first solder pad; and
        a solder bump on each of said first and second solder pads, and;
    the interposer electrically and mechanically connected to the first and second printed circuit boards by means of the solder bumps being soldered to the plurality of solder pads on the first and second printed circuit boards.

2. The printed circuit assembly of claim 1, wherein the circuit carrying substrate is the same type of material as the first and second printed circuit boards.

3. The printed circuit assembly of claim 1, wherein the circuit-carrying substrate is a glass reinforced printed circuit board material.

4. The printed circuit assembly of claim 1, wherein a portion of the plurality of solder pads are offset from the electrically conductive vias.

5. The printed circuit assembly of claim 1, wherein the electrically conductive vias are plated through holes.

* * * * *